United States Patent [19]

Moran

[11] 4,225,941
[45] Sep. 30, 1980

[54] CONTROLLER FOR BUBBLE MEMORIES

[75] Inventor: Richard M. Moran, Culver City, Calif.

[73] Assignee: TRW Inc., Los Angeles, Calif.

[21] Appl. No.: 955,945

[22] Filed: Oct. 30, 1978

[51] Int. Cl.$^3$ .............................................. G11C 19/08
[52] U.S. Cl. ...................................... 364/900; 365/1; 365/200
[58] Field of Search ....................... 365/1, 7, 11, 12, 15, 365/200; 364/200 MS File, 900 MS File

[56] References Cited

U.S. PATENT DOCUMENTS

| | | | |
|---|---|---|---|
| 3,792,450 | 2/1974 | Bogar et al. | 365/1 |
| 3,896,421 | 7/1975 | Flannery | 365/15 |
| 3,921,156 | 11/1975 | Yoshimi | 365/1 |
| 3,990,058 | 11/1976 | Archer et al. | 365/1 |
| 4,001,673 | 1/1977 | Barrett et al. | 365/34 |
| 4,045,779 | 8/1977 | Markle | 364/200 |
| 4,070,651 | 1/1978 | Naden | 365/1 |
| 4,073,012 | 2/1978 | Ohnigian et al. | 365/1 |
| 4,090,251 | 5/1978 | Flannigan et al. | 365/1 |
| 4,125,875 | 11/1978 | Saito | 365/1 |
| 4,139,886 | 2/1979 | White et al. | 365/1 |

Primary Examiner—Leo H. Boudreau
Attorney, Agent, or Firm—Spensley, Horn, Jubas & Lubitz

[57] ABSTRACT

This invention discloses a method for the simultaneous control and management of an arbitrary number of bubble memories, whereby the existence, locations, and defects of the blemished data positions in the bubble memory devices are managed by the invention, allowing the external device using the bubble memories to no longer be cognizant of the blemished data positions of the bubble memories. Specifically, this invention uses a shift register connected in a parallel manner to the bubble memories, a second shift register connected to the external data bus, a means for storage for the valid data positions in the bubble memory devices, and a means for gating data between the two shift registers in a serial manner, the gating means being controlled by the memory containing the valid data positions.

9 Claims, 6 Drawing Figures

FIG. 4

CONTROLLER FOR BUBBLE MEMORIES

BACKGROUND OF THE INVENTION

1. Field of the Invention

This invention deals with the simultaneous control and management of plural bubble memory devices and the blemished data positions contained within them. A blemished data position is a data position in a memory device which does not allow proper retrieval of data stored in it. Data retrieved from blemished data positions may always be a "0", a "1", or may be a random value, depending on the nature of the defect. The external data source or utilization device using the bubble memory devices is totally unaware of the existence and effect of the blemished data positions within the bubble memory devices, with the exception of the reduction in total storage data capacity caused by the blemished data positions.

2. Description of the Prior Art

In the production of solid state memory chips for use in computer memories the number of defective parts manufactured may far outnumber the production of perfect parts. Of course, defective parts are typically discarded. If a method could be devised for using defective parts the per unit cost of such devices could be substantially reduced. The prior art has disclosed a number of methods for the utilization or correction of partially defective solid state memory devices such as magnetic bubble memories. Some methods disclosed take advantage of certain modes of defects found in certain types of solid state memory devices. Other inventions disclosed general methods to correct errors in arbitrary types of memory systems. A third class of inventions disclose methods for the internal correction of errors in particular types of solid state memory devices. Such methods introduce additional complexities into the internal organization of the devices in order to mask the existence of the production defects.

An example of the first approach can be found in U.S. Pat. No. 4,045,779 to R. Markle whereby a method is disclosed for correcting errors in random access memory chips. The method is meant to correct errors of the type where no more than one of the bits in a memory word is permanently "stuck" at either a 1 or a 0. The method allows for the correction of an arbitrary number of such errors within the memory system so long as the errors are in the specified class. The method provides for separate storage of the addresses of memory words containing the errors and also for the storage of a flag bit for each of the memory words containing an error. When data is to be stored in a memory word known to contain a defective bit, the fact that the address matches an address in the separate error address memory storage is recognized. After the data is stored in the memory system, it is retrieved and compared to what was to have been stored there. If a difference is detected, the flag bit is set and the data to be stored in that word is complemented and rewritten. In this manner, due to the characteristics of the defect which are assumed, upon retrieval of the data from the memory word the flag bit will indicate that the data should be complemented. In this way, the error is corrected without action by the computer system external to the controlling circuitry for the memory system. Unlike the invention disclosed herein, this scheme requires additional memory cells above to be read or written. These cells are used as the flags to determine whether or not to complement the data fetched from memory addresses known be blemished. In addition, as previously mentioned, this method can be used only where the memory words contain a single bit error at most. This particular class of error is not the general type found with bubble memory systems containing blemishes within individual devices. Therefore, this scheme is inappropriate to bubble memory devices. In addition, the invention disclosed herein uses no scheme of complementing of data being stored in memory words containing blemishes.

Another class of method found in the prior art is typified by U.S. Pat. No. 4,032,765 to J. Epstein, et al. This prior art reveals a general method for the correction of data stored in memory words containing known blemishes. The invention disclosed in this patent provides for the storage of addresses containing known memory defects. In addition, for each of these memory addresses, sufficient auxiliary memory storage is provided to contain the data which was to have been stored in the memory word containing the blemish. Means are revealed to detect the attempted storage into memory words containing blemishes and for the routing of that data into the auxiliary memory storage. Retrieval of data from memory words containing known defects is routed to the auxiliary memory storage where it is fetched and patched into the memory bus as though the data were actually being provided from the main memory storage. Unlike the herein disclosed invention, this prior art requires additional storage able to be written into which will store the data meant to go to the memory addresses containing known errors. Such schemes requiring auxiliary read/write memory are not the most desirable means in order to correct memory systems since the auxiliary read/write memory must itself be defect free or have its own scheme for correcting its known defects. The invention disclosed herein requires no auxiliary read/write memory. All data is stored in the bubble memory devices, thereby eliminating the need for additional auxiliary read/write memory.

Magnetic bubble memory devices are a relatively new means of providing memory storage for computer systems. The methods of integrating such devices into existing computer technology is an area of technological endeavor of great current interest in the field. The prior art has disclosed several schemes which attempt to compensate for the production flaws often found within these devices. A magnetic bubble device can be roughly analogized as a shift register storage containing many bits of information. A blemish in the device may cause a series of regularly spaced data positions within the device to be inoperative. As data is shifted out of the device in a serial manner, the blemishes cause these positions to contain invalid data. These positions must therefore not be used for data storage and the contents of these positions must be ignored when the device is used for data retrieval.

The typical internal architecture of a magnetic bubble device consists of a number of minor loops containing the actual data. Each loop consists of a number of magnetic bubbles able to store one bit of data. The minor loops are like circular shift registers which can be stepped in unison. In close proximity to each minor loop is a transfer station which allows data to be transferred between each loop and a major loop. The major loop is the means for distributing data received by the device to the various minor loops used for the actual data storage.

U.S. Pat. No. 4,001,673 to G. Barrett, et al. suggest a method to "repair" a single bubble memory device containing blemishes. After detection of the defective data positions, the invention discloses a means for shorting out minor loops containing a blemish. The shorting out of the minor loops is done within the magnetic bubble device itself. A new construct within the device, called "repair stations", is used to effectively remove blemished minor loops from the device. As a result, the effective storage of each such "repaired" bubble memory device is variable, depending upon the number of blemished minor loops which are removed. Such resulting chips are difficult to incorporate into a memory system since they contain a variable number of effective data positions within them. Furthermore, the method requires additional approaches such as repair stations within each bubble memory device, complicating the internal organization of each such device. The invention disclosed herein is a means for blemish correction of plural bubble memories. It requires no additional correction or repair mechanism within the individual bubble memory devices.

U.S. Pat. No. 3,792,450 to J. Bogar et al. discloses an invention for the avoidance of data positions containing blemishes within a single bubble memory device. The control means includes within the device a control loop containing information as to the existence of the blemished minor loops. External circuitry uses the control loop information to inhibit data transfer to or from blemished data loops. This invention once again requires additional complexity within the bubble memory device. In this case, a control loop is required for the storage of the positions of the blemished minor loops. In addition, the effective storage of each bubble memory device depends upon the number of blemished minor loops.

Figure 1:
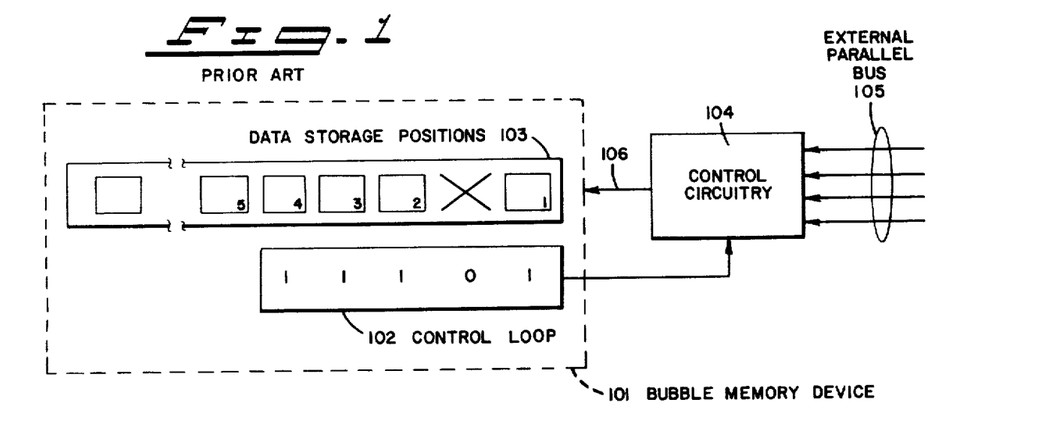
FIG. 1 portrays a prior art method of storing parallel data into a single bubble memory device, whereby the management of the valid data positions is aided by a control loop within the bubble memory device.

FIG. 1 diagrams the functional operation of a method for controlling a bubble memory device like that proposed in the Bogar patent. A bubble memory device 101 contains the data positions used for storage 103 and the control loop 102 storing the information as to the locations of the blemished data positions. The squares indicate valid data positions within the bubble memory device 101, these positions able to be used for storage and retrieval of information. The X's indicate data positions within the bubble memory device which are blemished. The control circuitry 104 external to the bubble memory device 101, uses the information contained in the control loop 102 to manage the transfer of data between the external parallel bus 105 and the bubble memory device 101. The numbers within the lower right hand corner of the squares indicate the order in which the control circuitry 104 will store the data as received from the parallel bus. As indicated, the control circuitry 104 will properly skip the blemished data positions in the storage of data. This scheme could be characterized as one in which data received in parallel is disassembled into a serial data stream, said stream being interrupted by the control loop memory so as to cause the blemished data positions to not be used for data storage. Although this method is quite suitable for the control and management of a single bubble memory device, the scheme is inappropriate for use in a memory system containing many bubble memory devices inasmuch as the control circuitry disassembles a parallel input stream into a single serial data stream to a single bubble memory device. Required in a bubble memory system containing multiple bubble memory devices is a control means whereby parallel data can be received from the external circuitry and an independent parallel interface to the multiple bubble memory devices is supported. An object of the present invention is to provide such a system.

SUMMARY OF THE INVENTION

The invention herein disclosed provides a means for the controlling and managing of an arbitrary number of magnetic bubble memory devices, each device possibly having one or more data position blemishes within it. By providing an effective means for the utilization of blemished bubble memory devices in a computer memory system, the effective cost of the bubble memory devices is decreased since the bubble memory devices need no longer be blemish free.

The invention provides a means for the control of a bubble memory system containing many bubble memory devices. Read-only-memory storage is provided, containing the locations of the blemishes for each of the bubble memory devices within the bubble memory system. No blemish position repair means or storage means is required within the bubble memory devices themselves. This allows the simplification of the design of the individual bubble memory devices.

Furthermore, every properly functioning data position in each bubble memory device is utilized, allowing for the maximum possible total data storage capacity in the bubble memory system. Unlike other methods found in the prior art whereby the data storage of each bubble memory is reduced to a storage capacity able to be satisfied by the most blemished bubble memory device in the memory system, the invention described herein allows maximum use of each bubble memory device's actual data storage capacity, irrespective of the effective storage capacity in other such devices in the memory system.

In addition to the above characteristics, the invention will support either a serial interface or a parallel interface or arbitrary width to the external circuitry which is providing data or utilizing the bubble memory storage system.

DETAILED DESCRIPTION OF THE PREFERRED EMBODIMENTS

As earlier discussed, FIG. 1 functionally illustrates a prior art method for the control and management of a single bubble memory device. This method provides an additional control loop 102 within the bubble memory device 102 which serves to record the existence of the valid data positions. The control circuitry 104, by use of the control loop 102, interrupts or inhibits the serial shifting of data onto the line 106 when a blemished data storage position is currently accessible. A serial data stream 106 to the bubble memory device 101 is thereby created, this data stream being properly organized to avoid the blemished data positions.

Figure 2:
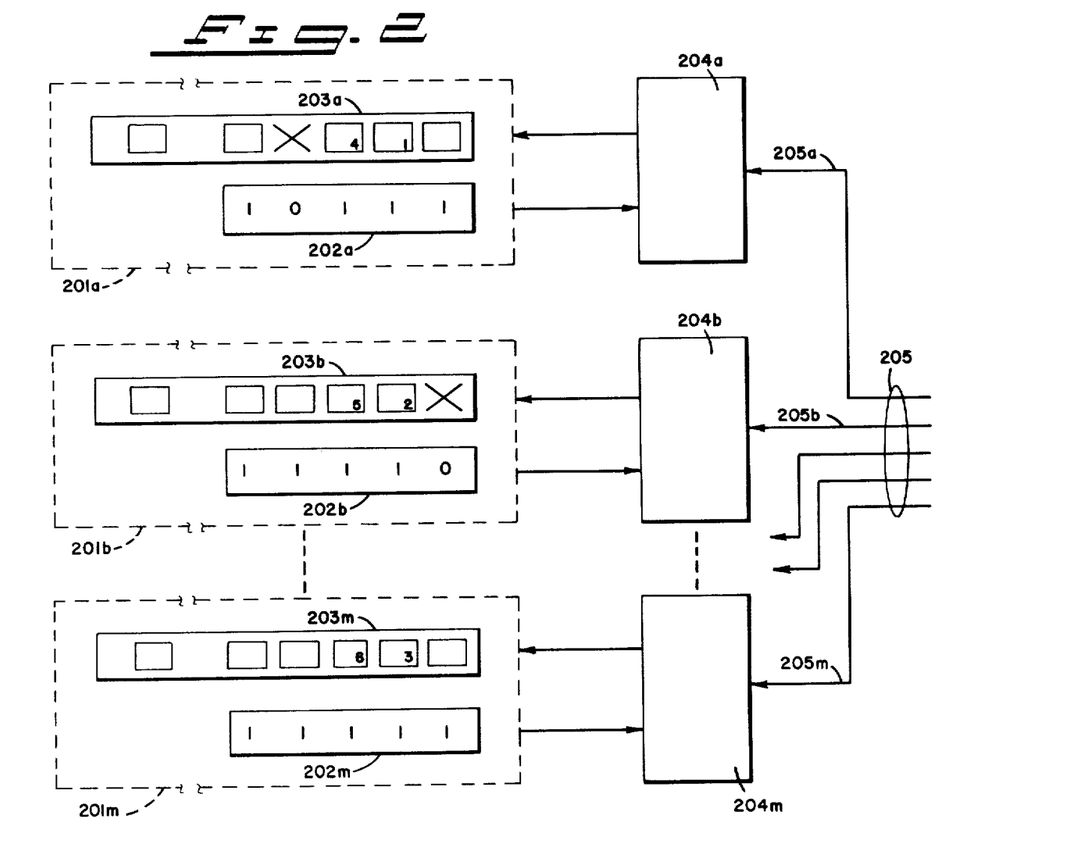
FIG. 2 portrays one means for the storage of information in multiple bubble memory devices.

FIG. 2 illustrates a possible way in which the single memory serial data transfer scheme of FIG. 1 might be extended to the control of plural bubble memory devices. The bubble memory devices 201a, 201b, . . . 201m each contain data positions 203a, 203b, . . . 203m and control loop storage 202a, 202b, . . . 202m. The squares indicated valid data positions within the bubble memory devices and the X's indicate the blemished data positions. Each bubble memory device contains control circuitry 204a, 204b, . . . 204m for the storage of data in the bubble memories according to the control loop information concerning the existence of valid data positions. A parallel bus 205 to the external users of the bubble memory system connects to each of the control circuitries. As illustrated, each data line 205a, 205b, . . . 205m of the data bus 205 is connected to an individual bubble memory device's control circuitry 204a, 204b . . . . 204m. At the time the first word of information received from the parallel data bus 205 is ready for storage in the bubble memory devices 203a, 203b, . . . 203m, the right most positions of the bubble memory devices are available. As indicated in FIG. 2, one of the bubble memory devices—201b—contains a blemished data position at that time. This would require that no data transfer to the bubble memory devices be permitted since one of the bubble memory devices was unprepared to properly store the data. Upon advancing the accessible data positions of the bubble memory devices, the second position from the right in each bubble memory device is available for storage. FIG. 2 illustrates that all bubble memory devices will then have valid data positions available for storage. The squares numbered 1, 2, and 3 illustrate that the data could be properly stored in those data positions. Utilization of the bubble memory devices as a bubble memory system could continue in this fashion. The data positions with the numbers 4, 5 and 6 within them indicate that the advancement of the bubble memory devices to the third position would also be satisfactory.

The concept behind such a method for controlling blemished bubble memory devices is that for each data line 205a, 205b, . . . 205m in the external parallel bus, 205, there is a fixed and specific bubble memory bubble device which will store the data available on the corresponding signal line. In FIG. 2 bubble memory device 203a stores the information available on signal line 205a of the parallel bus 205. Due to this one-for-one correspondence between data lines in the external parallel bus 205 and the bubble memory devices, the parallel storage of data cannot occur if any of the bubble memory devices has a blemished data position as its currently accessible storage position. The existence of a data position blemish in any one of the bubble memory devices prevents the utilization of the simultaneously accessible validly functioning data positions in the remaining bubble memory devices. It is an object of the preferred embodiments of the herein disclosed invention to overcome this difficulty, allowing for the use of all valid data positions within the bubble memory devices. A parallel transfer between the control circuitry and the bubble memory devices is supported. Furthermore a parallel bus structure of arbitrary width, not related to the number of bubble memory devices, serves as interfacing means to the external circuitry using the bubble memory system.

Figure 3:
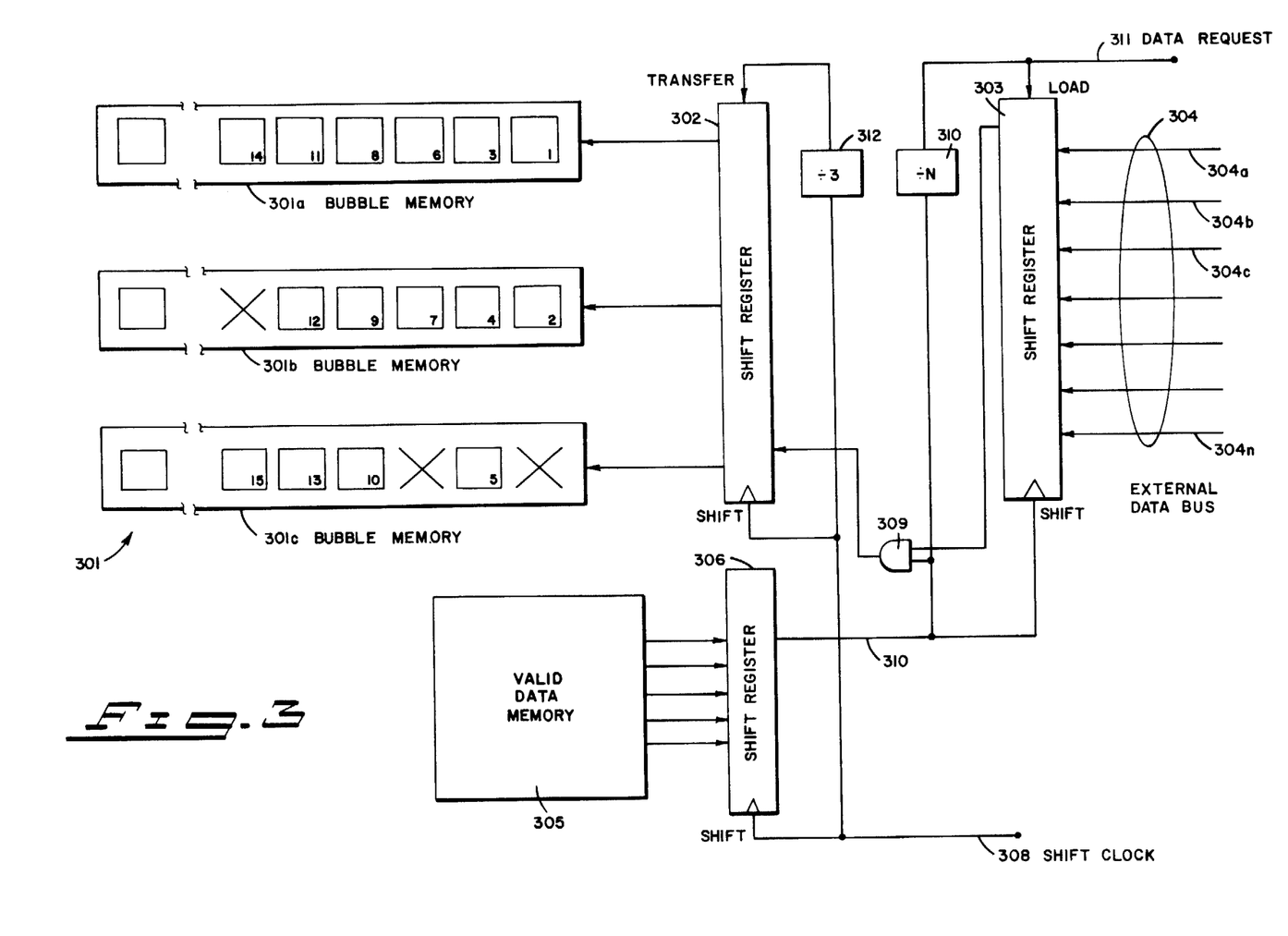
FIG. 3 illustrates the herein disclosed preferred method of controlling data transfer to or from plural bubble memory devices.

FIG. 3 illustrates the functional operation of the present invention. The three bubble memories 301a, 301b, and 301c contain no control loop information within them. They are used strictly for data storage. A separate valid data memory 305 contains information as to the location within the bubble memory devices 301a, 301b, and 301c of the blemished data positions. The valid data memory 305 may be a separate read-only memory, or optionally may be physically located within one or more of the bubble memory devices 301a, 301b, and 301c. However, for purposes of illustration, the valid data memory is portrayed as distinct from the bubble memory devices. The bubble memories connect to a shift register 302. The N bit wide external data bus 304 connects in a parallel manner to another shift register 303. The valid data memory 305 is connected to a third shift register 306. A separately provided shift clock signal is connected at terminal 308. Not shown are the various other system signals used to advance the bubble memory devices and valid data memory, to manage the parallel bus, and so forth.

For purposes of explanation the diagram illustrates the signal flow for writing to the bubble memory devices. In reading the bubble memory devices a similar flow of information from the bubble memory devices through the shift registers to the parallel data bus occurs. Since a more detailed description of the invention will be provided below, the situation in reading the bubble memory devices will not be commented upon further for this FIG. 3.

Assume that the parallel data bus 304 has previously transferred data to the external data bus shift register 303, and that the valid data memory 305 has also transferred information as to the existence of blemished data positions at locations currently available for memory input or output to its shift register 306. These transfers will generally not be done in synchronism. The next clock pulse on terminal 308 causes shift register 306 to shift one bit of information onto signal line 310 providing information as to the existence of a valid data position in the first bubble memory 301a at an input to AND gate 309. If a valid data position is indicated by a "1" bit being shifted out of the valid data memory shift register 306, the data bus shift register 303 will have its first bit of data shifted out to the AND gate 309. The AND gate 309 connects to the bubble memory shift register 302, thereby transferring the bit of information in a serial manner from the data bus shift register 303 to the bubble memory shift register 302. The next clock pulse on the shift clock terminal 308 performs a similar operation and potentially transfers one more bit of information to the bubble memory shift register 302.

Assuming the information shifted from the valid data memory device's shift register 306 is a "0", indicating a blemished data position, the "0" will inhibit the shifting of data from the data bus shift register 303. Nevertheless the shift clock pulse generated on terminal 308 will cause the shifting of the bubble memory device's shift register 302. As a result, a dummy bit (herein a "0") is effectively loaded into the shift register 302 position from which data externally will be transferred to the blemished data position in the bubble memories. In this way the avoidance of blemished data positions is managed.

After signal line 310 has had sufficient pulses, one per valid available data positions of the bubble memory, to cause the complete shifting of shift register 303, the shift register 303 is reloaded from the external data bus by the output of the ÷N counter 310. Asynchronous from this, after the appropriate number of clock pulses have occurred on the shift clock terminal 308 to completely fill the shift register 302, the ÷3 counter 312 causes the contents of the shift register 302 to be transferred in parallel into the available bubble memory 301 storage locations. All of the valid data storage locations will be filled, and "dummy" bits will be sent to the blemished data storage locations. The bubble memories 301 then will be appropriately advanced. When the contents of the valid data shift register 306, have been completely shifted out, the valid data memory 305 is appropriately advanced, and the shift register 306 is reloaded from the valid data memory 305.

The numbers in the lower right hand corners of the boxes indicate the order in which the data positions of the bubble memory devices 301 are utilized. If the system was started from a reset condition, the first word of data transferred by the external data bus line 304 will have the bit of information transferred on signal line 304a stored in the valid data position labeled with a 1 in bubble memory device 301a. The bit of data transferred on signal line 304b will be stored in valid data position labeled 2 in bubble memory device 301b; the data transferred on signal line 304c is stored in bubble memory device 301a in the position labeled 3. As can be seen, there is no direct relationship between an individual signal line 304a, 304b, . . . of the external bus 304 and a bubble memory device. Unlike the earlier described method, this method provides for the use of all bubble memory valid data positions, irrespective of the existence of one or more blemished data positions.

After shift register 303 has been shifted N times, the ÷N counter 310 sets a data request signal line 311 high, thereby requesting additional data, and causes this new data to be loaded into shift register 303.

Figure 4:
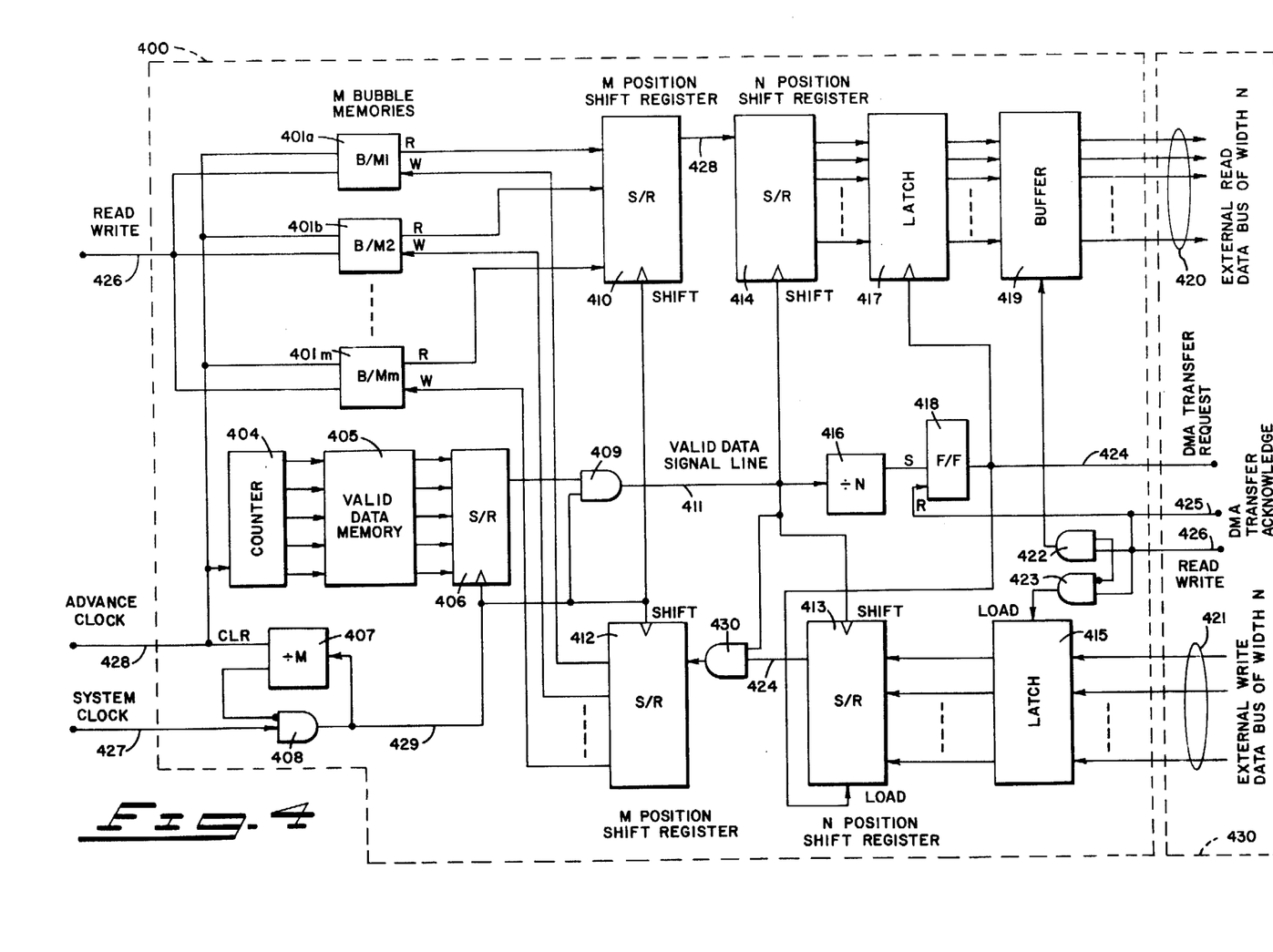
FIG. 4 is an electrical schematic diagram of the embodiment of the disclosed invention also illustrated in FIG. 3.

FIG. 4 illustrates a more detailed embodiment of the invention. For conceptual purposes two data busses 420 and 421 are illustrated as interfacing with the bubble memory system circuitry 400. Both data busses are able to transfer in parallel N bits of information. Data bus 420 is used for the reading of data from the bubble memory devices. Data bus 421 is used for the transfer of information to the bubble memory devices. The direct memory access (DMA) transfer request line 424 is used by the circuitry 400 to request a word of data to be transferred on the appropriate data bus by the external circuitry 430. The DMA transfer acknowledge line 425 is used by the external circuitry 430 to indicate that the requested DMA transfer has been performed. Signal line 426 is used to indicate whether a read or write operation is to be performed; for purposes of this schematic it is assumed that a high signal on the line 426 indicates a read request whereas a low signal on the line indicates a write request. Two clock signals are provided. The system clock signal 427 is used to pace the internal data transfers of the circuitry 400. The advance clock 428 is used to advance the bubble memory devices 401a, 401b, . . . 401m to their next available data positions. Although these two clocks 427 and 428, are illustrated as separate and independent, it is possible to derive the advance clock 428 from the system clock 427 by an appropriate division circuitry. The illustrated embodiment has M bubble memory devices 401a, 401b, . . . 401m. The memory 405 containing the information as to the valid data positions of the bubble memory devices 401 connects to valid data memory shift register 406. If we assume that the read/write signal line 426 indicates a read operation is to be performed, the bubble memory devices are so informed. When a pulse is generated on the advance clock signal line 428, the bubble memory devices 401a, 401b, . . . 401m are advanced to their next data positions. Furthermore, the counter circuitry 404, is advanced, presenting the valid data memory 405 with the new address. Upon receiving the new address, the valid data memory 405 fetches the information as to the valid data positions now available at the bubble memory devices and transfers the information to the valid data memory shift register 406. Occurrence of the advance clock signal causes the clearing of the ÷M circuitry 407. This ÷M circuitry, in conjunction with AND gate 408 allows a total of M system clock pulses to be created on signal line 429 for each pulse on the advance clock signal line 428. It is necessary that the rate of pulses on the system clock signal line 427 be at least M times the rate of pulses on the advance clock signal 428 so as to cause M clock pulses on signal line 429 for each pulse on the advance clock signal line 428. Each of the M system clock pulses available on signal line 429 cause the shifting out of one bit from the valid data memory shift register 406. This memory blemish information is gated with the pulses on clock signal line 429 at AND gate 409, creating "valid data" pulses on a signal line 411.

The M bubble memory devices 401a, 401b . . . , 401m present to the M-position shift register 410 the contents of the bubble memories at the newly accessible data positions of each of the bubble memory devices. This shift register 410 is connected via the serial line 428 to the N-position shift register 414, which then connects via a latch 417 and buffer 419 to the external read data bus 420. As indicated in the circuit 400, the shift register 410 is clocked via the clock signal line 429, whereas shift register 414 is clocked via the valid data signal line 411. As clock pulses are available on line 429, the shift register 410 is shifted one position, generating data on the line 428. Depending upon the contents shifted from the valid data memory shift register 406, line 411 will cause the shifting of shift register 414. In essence, although information is regularly shifted out of the shift register 410, it is accepted by shift register 414 only when the valid data memory 405 indicates that data from a valid data position of one of the bubble memory devices is being transferred on line 428. The ÷N counter 416 sets flip-flop 418 when N bits of valid data have been received by shift register 414. When these N bits are available in the shift register 414, the the flip-flop 418 is set, causing latch register 417 to record the contents of shift register 414. Furthermore, a DMA transfer request is made via line 424. AND gates 422 and 423 decode the signal on the read/write signal line 426. Upon occurrence of a read level from the read/write signal line 426 and the occurrence of a DMA transfer acknowledge 425, AND gate 422 causes the transfer of information from the latch register 417 to the output bus buffer 419. At this time the information in the output bus buffer 419 is available on the external read data bus 420. Furthermore a high signal on the DMA transfer acknowledge request line 425 causes the resetting of flip-flop 418 and the resetting of the output latch 417 and the resetting of the DMA transfer request line 424.

A write operation to the bubble memories 401 is performed in a similar manner. Specifically the input data bus 421 is used to load the input latch register 415. AND gate 423 is used to create a signal causing the loading of the input latch register 415 when the read-/write signal line 426 indicates that a write is to be performed and the DMA transfer acknowledge line 425 indicates that the function is available on the input data bus 421. The input shift register 413 is loaded with contents of the input latch register 415 when the DMA transfer request line 424 goes high indicating that additional data is required for writing into the memories 401 via the shift register 412. Once the data is in shift register 413, it is shifted in a serial manner bit by bit via line 424 and AND gate 430 to shift register 412 according to the gated system clock pulses as found on valid data signal line 411. As earlier discussed, system clock pulses are available on valid data signal line 411 only when the valid data memory 405 so specifies that information is to be transferred to or from a valid data position within one of the bubble memory devices. On the other hand, shift register 412 is shifted by each of the system clock pulses, irrespective of the contents of the valid data memory.

The AND gate 430 insure that "dummy" bits will be entered into positions of the shift register 412 associated with blemished locations in memory 401. After M system clock pulses, shift register 412 will be loaded with data at each register position corresponding to an accessible valid data position in the bubble memory device, 401a, 401b, ... 401m. The next clock pulse on the advance clock signal line 428 will cause the parallel transfer of the data in shift register 412 to the bubble memories 401a, 401b, ... 401m. As noted, due to the nature of the signal line 411, data is transferred from shift register 413 to shift register 412 only when the data transfer will be eventually transferred to a valid data position within one of the bubble memory devices.

By means of this method all valid data positions within the bubble memory devices will be loaded with data from the data bus. Unlike the scheme portrayed in FIG. 2, there is control circuitry which can take into account the fact that each of the bubble memory devices may not have a valid data position accessible, yet utilize the storage available at the remaining bubble memory devices.

Figure 5:
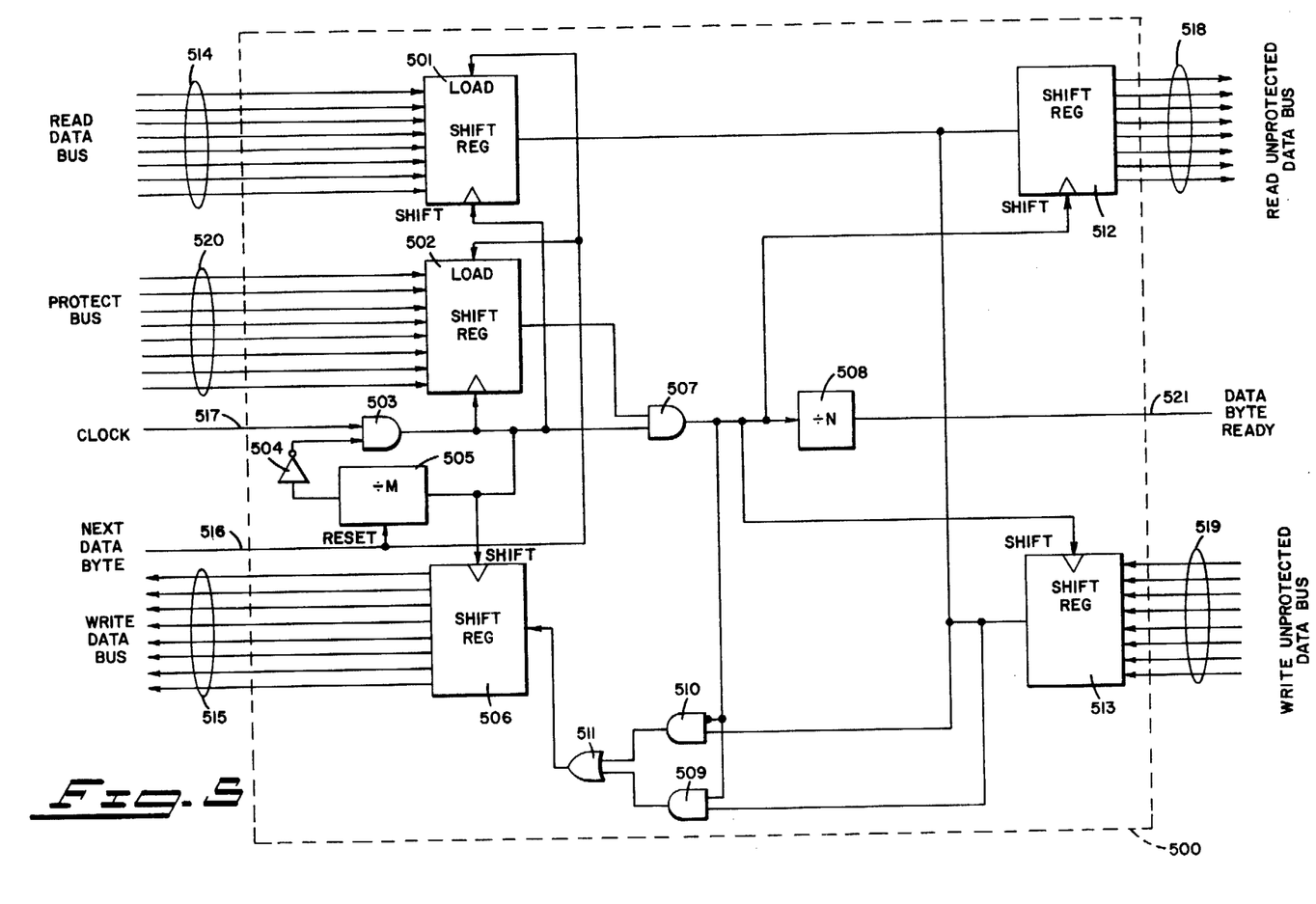
FIG. 5 is an electrical block diagram of a second embodiment of the invention.

Although especially suitable for the control and management of blemished bubble memory devices, the disclosed invention also has a wider range of utility. A second and separate embodiment of the invention is illustrated in FIG. 5. The illustrated circuit is for the selective transfer of information between two data busses, the information being transferred being specified by protection flags. Busses 514 and 515, each of width M bits, are used to transfer data between the information system being protected and the control circuitry 500. Busses 518 and 519, each of width N bits, serve to transfer unprotected data between the control circuitry 500 and the user of the unprotected data. Protection flags are transferred via a M bit parallel protection bus 520 to a protection shift register 502. These protection flags are used to selectively control the transfer of information from the M-bit read data bus 514 to the N-bit read unprotected data bus 518. Conversely the protection flags are also used to selectively disable the writing of information received on the N-bit write unprotected data bus 519 to the M bit write unprotected data bus 519 to the M bit write bus 515. It is assumed that the clock signal line 517 is provided a steady stream of clock pulses. The next data byte signal line 516 is assumed to go high whenever a new data byte is able to be transferred from the control circuitry 500 to the system being protected. It is assumed that sufficient clock pulses will occur between the next data byte pulses to allow the shifting out of information from the shift registers 501 and 502.

For the purpose of illustration, assume that data is to be transferred from the read data bus 514 to the read unprotected data bus 518 and the protection bus 520 contains the appropriate information as to the specific lines within the read data bus 514 which are to be allowed to be transferred to the read unprotected data bus 518. When the next data byte signal line 516 goes high it causes a shift register 502 to be loaded with the contents of the protection bus 520. In addition it resets the ÷M counter 505. This counter, in conjunction with the inverter 504, allows a total of M clock signals to be gated through AND gate 503. The output of AND gate 503 is used to clock out the data received in shift register 501. It furthermore shifts out the information stored in the protection shift register 502 into the AND gate 507. Depending upon the information shifted from the protection shift register 502, AND gate 507 will allow the shifting of the data into the shift register 512. In this manner the data is reassembled in shift register 512 according to the protection flags. After N bits of information have been transferred, the data byte ready signal line 521 is set high by the ÷N counter.

In transferring data from the write unprotected data bus 519 to the write data bus 515 a similar scheme is used. As was done with shift register 512, shift register 513 is shifted according to the protect flag bits shifted into AND gate 507. Irrespective of the information shifted from the protect shift register 502, the write data shift register 506 is shifted from each clock pulse available at the AND gate 503. AND gates 510 and 509 and OR gate 511 are used to select between the information received from the write unprotected data bus 519 and the information available on the read data bus 514. Assuming the output of AND gate 507 is high, indicating that the data is not protected against modification by the write unprotected data bus 19, then AND gate 509 allows the shifting of information from the write unprotected data shift register 513 through the OR gate 511 to the write data shift register 506. If the output of AND gate 507 is low, indicating that the corresponding signal line on the write data bus 515 should not be modifiable by the write unprotected data bus 519, then AND gate 510 allows for the returning of the protected bit of data via the read data bus 514 and its corresponding shift register 501 to the write data shift register 506. In this way the data stored in the information system is rewritten to itself when it should not be modified by the write unprotected data bus 519.

Figure 6:
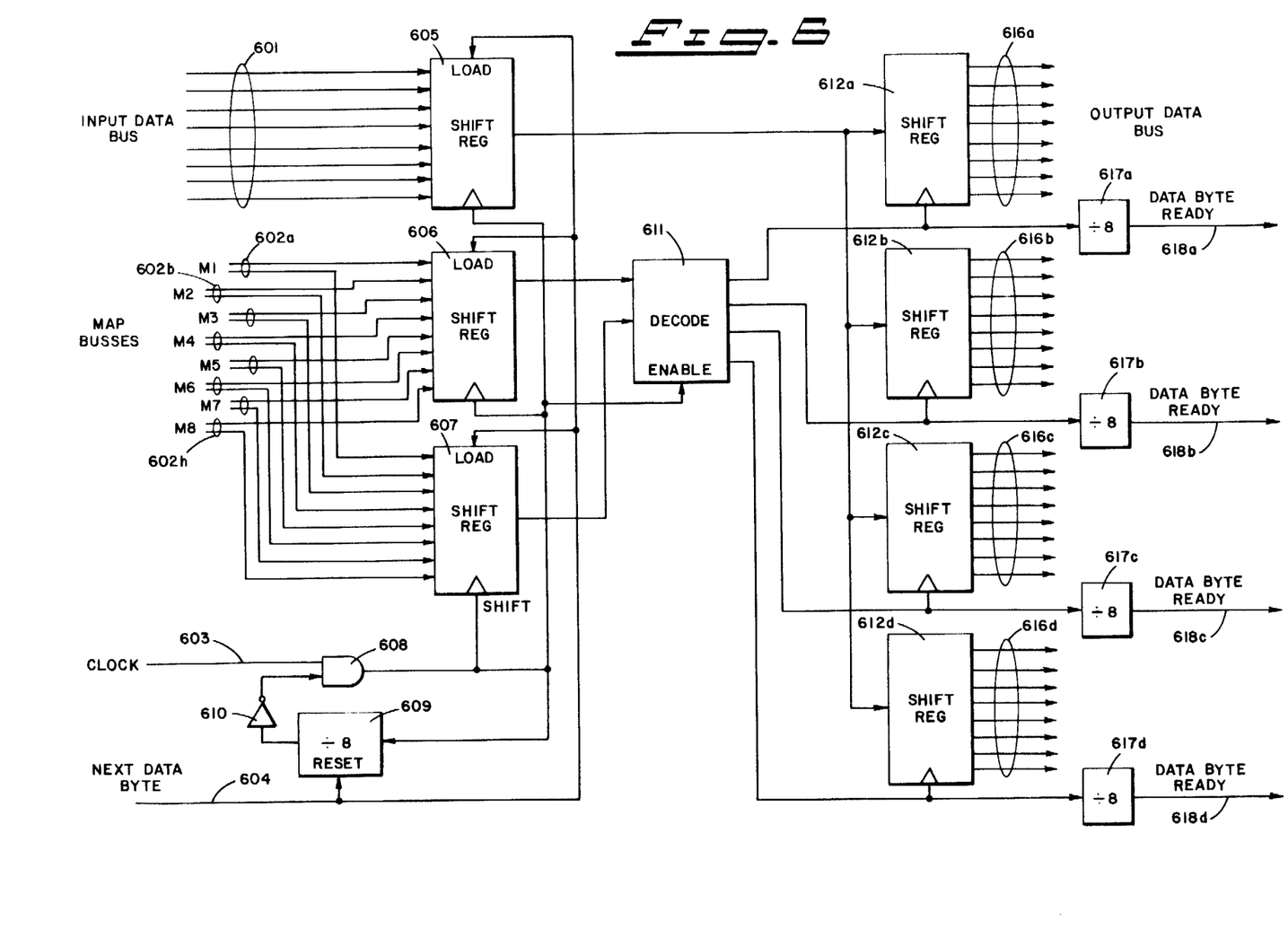
FIG. 6 is an electrical block diagram of a third embodiment of the invention.

A third embodiment of the invention, applicable to a general problem, is illustrated in FIG. 6. This circuit is meant to provide a means for the arbitrary mapping of data information received on the input data bus 601 to any of the illustrated circuit data busses 616a, 616b, 616c and 616d. Although not portrayed in the embodiment of FIG. 6, the invention is equally applicable to the bidirectional transfer of data between a number of busses and a single bus, such transfer as specified by a collection of map busses. Although the invention is suitable for an arbitrary size input data bus and arbitrary size and number of output data busses, FIG. 6 illustrates an input data bus of 8 bits and four output data busses 616 each of 8 bits. Although each of the output busses 616a, and 616d are shown as transferring eight bits, there is no necessity that the output busses be such to transfer the same number of bits. Each output bus could be of independent width, with corresponding adjustment of the output data byte ready counter 617a, ..., 617d.

Provided externally are eight map busses 602a through 602h of two lines each 2a, 2b ... and 2h.

In the general situation, there is a map bus corresponding to each data signal line on the input data bus 601. The width of each of the map busses is determined by the possible number of output busses. In the circuit illustrated in FIG. 6, two signal lines in a map bus can specify any of the four output busses 616a through 616d. The high order signal lines of each of the map bit busses is connected to shift register 606, and the low order signal line of the 8 map bit busses is connected shift register 607. The next data byte signal line 604 is assumed to be pulsed once for each data byte present on the data input bus 601. The clock signal line 603 is assumed to consist of a regular number of clock pulses of such frequency that an excess of 8 are generated between each next data byte pulse. The ÷8 counter 609, the inverter 610 and the AND gate 608 serve to allow only 8 clock pulses to be gated for each next data byte pulse. The output of AND gate 608 is used to shift one bit out of each of the three shift registers 605, 606 and 607. The output of shift registers 606 and 607 are connected to the decode module 611. This module is used to determine which of the 4 output lines are to be enabled to receive the data bit being transferred. Depending on which output line from module 611 in enabled one of the four shift registers 612a, 612b, 612c and 612d is shifted, allowing the shifting of the data from the output of shift register 605 into the appropriate output data bus. In this manner the 8 map bit busses determine bit by bit the destination of the data received on the data input bus 601. The ÷8 counters 617a, 617b, 617c and 617d are used to set the appropriate data byte ready signal line 618a, 618b, 618c and 618d whenever 8 bits of information. are received in the corresponding output shift register 612a through 612d. When a data byte ready signal is set high, the appropriate output data bus receives the information as contained in the appropriate shift register.

While only a limited number of embodiments of the disclosed invention have been discussed herein, it will be readily apparent to persons skilled in the art that certain changes and modifications may be made without departing from the spirit of the invention for instance, the invention may control other types of memory devices, e.g. crosstie memories, in a suitable manner. Similarly, the invention may control memory devices in which several data transfer lines to each memory device are provided. Accordingly, the foregoing disclosure, description, and figures are for illustrative purposes only, and do not in any way limit the invention, which is defined only by the claims.

I claim:

1. An apparatus for directing the selective transfer of m individual data bits between a first m-bit parallel data bus and a plurality of other parallel data buses each having a respective set of independent parallel lines, in accordance with steering data provided via a steering data bus, comprising:

steering circuit means, connected to said first bus, said other buses and said steering data bus, for sequentially transferring said m data bits between said first bus and selected independent lines of said other buses in accordance with provided steering data associated with each of said individual bits.

2. An apparatus according to claim 1 wherein said steering circuit means comprises:

a first shift register having m storage locations each connected to a corresponding line of said first m-bit parallel data bus, said first shift register being shifted m times between occurrences of successive m-bit parallel data on said first data bus, and decoder means for selectively gating each serially shifted bit between said first shift register and the selected independent line associated with the data bit as specified by said provided steering data.

3. An apparatus according to claim 2 wherein said steering circuit means comprises:

plural other shift registers each connected to one of said other parallel data buses, the serial data terminal of each other shift register connecting to the serial data terminal of said first shift register, the shift terminal of each other shift register connecting to said decoder means for the selective shift enabling thereby.

4. An apparatus according to claim 2 wherein each other shift register and the other data bus to which it is connected are identified respectively as the $i^{th}$ other shift register and the $i^{th}$ other data bus, where $i = 1, 2, 3, \ldots, N$ and N is the total number of such other shift registers, said $i^{th}$ other data bus being able to transfer $j_i$ data bits in parallel, said apparatus further comprising:

plural separate transfer means, each associated with an other shift register, for enabling the transfer of data between said associated other shift register and its associated other data bus when said $i^{th}$ associated other register has been enabled for $j_i$ shifts.

5. An apparatus for selectively transferring data to and from an m-row utilization array, said array having known positions from which data is to be excluded, data being transferrable to and from said array in parallel via an m-bit port, successive columns of said array being accessible upon occurrence of array access signals, comprising:

first parallel register means, connected to said m-bit port, for transferring data in parallel to or from said array upon occurrence of an array access signal;

control means, responsive to signals indicative of said known positions, for selectively transferring data to or from locations of said first parallel register means corresponding to positions in an accessible array column from which data is not to be excluded, valid data memory means, cooperating with said control means, for storing said signals indicative of known positions in said utilization array from which data is to be excluded, said memory means being accessed in relation to occurrence of said array access signals and supplying said position indicative signals to said control means, a second parallel register means, connectable to an n-bit input/output data port, said control means comprising circuitry, interconnecting said first and second parallel register means, for transferring data therebetween in serial form, said circuitry being configured to inhibit such transfer of data to or from locations in said first parallel register means specified by said position indicative signals accessed from said memory means, and having;

another like first parallel register means and another like second parallel register means, and wherein;

said utilization array is connected to said first parallel register means via a "read data" bus and a second utilization array is connected to said other first parallel register means via a "write data" bus, said control means circuitry further interconnecting said other first and other second parallel register means, the contents of said valid data memory means being utilized by said control means circuitry to selectively transfer data between said first and second parallel register means and between said other first and other second parallel register means.

6. An apparatus according to claim 5 wherein said control means circuitry further interconnects said first parallel register means and said other first parallel register means and permits data transfer therebetween only upon access of certain known position indicating signals from said valid data memory means.

7. An apparatus for selectively transferring data to and from an m-row utilization array, said array having known positions from which data is to be excluded, data being transferrable to and from said array in parallel via an m-bit port, successive columns of said array being accessible upon occurrence of array access signals, comprising:

first parallel register means, connected to said m-bit port, for transferring data in parallel to or from said array upon occurrence of an array access signal;

control means, responsive to signals indicative of said known positions, for selectively transferring data to or from locations of said first parallel register means corresponding to positions in an accessible array column from which data is not to be excluded, a plurality of second parallel register means, each connectable to a corresponding parallel data port of arbitrary width, and steering data supply means, cooperating with said control means, for supplying said position indicative signals, said signals further indicating which of said corresponding parallel data ports is to be the source or destination of data from each position in said accessible array column from which data is not to be excluded, said control means comprising circuitry, interconnecting said first parallel register means and said plurality of second parallel register means, for selectively transferring data bits in serial between said first parallel register means and specific ones of said second parallel register means in accordance with the position indicative signals supplied from said steering data supply means.

8. An apparatus for controlling the transfer of data between an m-bit parallel external data bus and a plurality n of bubble memories some of which contain defective storage sites at which data cannot be stored, said apparatus comprising:

a first shift register having n storage locations, each storage location connected to one corresponding bubble memory for parallel data transfer between said bubble memories and said first shift register, a second shift register having m storage locations connectable to said external data bus for parallel data transfer therebetween, serial interconnection means for serially transferring data between said first and second shift registers, a "valid data" memory storing signals identifying the locations of said bubble memory defective storage sites, shift control means, cooperating with said "valid data" memory and with said serial interconnection means, for causing data to be transferred between said first and second shift registers only to or from storage locations in said first shift register associated with accessible non-defective bubble memory storage sites identified by signals accessed from said "valid data" memory, said shift control means further comprising:

a shift clock generation circuit, generating a first series of shift pulses, connected to said first shift register to cause the serial shifting of data in or out thereof, and "valid data" shift control logic, cooperating with said "valid data" memory and with said shift clock generation circuit, providing "valid data" shift pulses to said second shift register, each "valid data" shift pulse being in synchronism with one of said first series of shift pulses but occurring only when said data being transferred to or from said second shift register originated from or is destined for a non-defective bubble memory storage position, said second shift register being connected to an external originator or user of data via said m-bit parallel external data bus, load control circuitry, cooperating with said "valid data" shift control logic, for enabling the parallel loading of data from said second shift register to said external data bus or from said external data bus to said second shift register upon occurrence of each group of m "valid data" shift pulses, and wherein;

said external data bus includes associated control lines including:

a transfer request line for requesting of the originator or user of data to perform a data transfer via said external bus, and a transfer knowledge line, controlled by said data originator or user, for acknowledgement of such transfer after occurrence of a request via said request line, together with:

request control circuitry, cooperating with said load control circuitry and with said transfer request and acknowledge lines, for coordinating the loading of data from or to said second shift register with occurrence of request and acknowledgement signals from said request and acknowledge lines.

9. An apparatus for controlling the transfer of data between an m-bit parallel external data bus and a plurality n of bubble memories some of which contain defective storage sites at which data cannot be stored, said apparatus comprising:

a first shift register having n storage locations, each storage location connected to one corresponding bubble memory for parallel data transfer between said bubble memories and said first shift register, a second shift register having m storage locations connectable to said external data bus for parallel data transfer therebetween, serial interconnection means for serially transferring data between said first and second shift registers, a "valid data" memory storing signals identifying the locations of said bubble memory defective storage sites, shift control means, cooperating with said "valid data" memory and with said serial interconnection means, for causing data to be transferred between said first and second shift registers only to or from storage locations in said first shift register associated with accessible non-defective bubble memory storage sites identified by signals accessed from said "valid data" memory, said apparatus connecting to an external originator or user of data via said m-bit parallel external data bus, and further comprising:

a transfer request line for requesting the originator or user of data to perform a data transfer via said data signal lines, a transfer acknowledge line, controlled by said data originator or user, for acknowledgment of the occurrence of a data transfer after such transfer was requested by use of said transfer request line, a "valid data" pulse circuit, a constituent of said shift control means, connected to said second shift register and able to cause the shifting of said second shift register by the generation of "valid data" shift pulses, each said "valid data" shift pulse occurring only when data to be transferred between said first shift register and said second shift register is destined for or originated from a non-defective bubble memory storage site, and a second shift register counter circuit, connected to receive "valid data" shift pulses from said "valid data" pulse circuit, said counter circuit having an output signal line and a reset signal line, said output signal line being pulsed for each m "valid data" shift pulses, said output signal line being connected to and controlling said transfer request line, said transfer acknowledge line being connected to said reset signal line to cause the clearing of said counter circuit.

* * * * *